(12) United States Patent
Naik et al.

(10) Patent No.: US 9,590,096 B2
(45) Date of Patent: Mar. 7, 2017

(54) VERTICAL FET HAVING REDUCED ON-RESISTANCE

(71) Applicant: Infineon Technologies Americas Corp., El Segundo, CA (US)

(72) Inventors: Harsh Naik, El Segundo, CA (US); Timothy D. Henson, Mount Shasta, CA (US); Niraj Ranjan, El Segundo, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/942,911

(22) Filed: Nov. 16, 2015

(65) Prior Publication Data

US 2016/0172484 A1 Jun. 16, 2016

Related U.S. Application Data

(60) Provisional application No. 62/092,176, filed on Dec. 15, 2014.

(51) Int. Cl.
*H01L 29/66* (2006.01)
*H01L 29/78* (2006.01)
*H01L 29/10* (2006.01)
*H01L 29/06* (2006.01)
*H01L 29/16* (2006.01)

(52) U.S. Cl.
CPC ...... *H01L 29/7813* (2013.01); *H01L 29/0696* (2013.01); *H01L 29/1045* (2013.01); *H01L 29/1095* (2013.01); *H01L 29/16* (2013.01)

(58) Field of Classification Search
CPC ................................ H01L 29/78; H01L 29/08
See application file for complete search history.

(56) References Cited

U.S. PATENT DOCUMENTS

2013/0234156 A1* 9/2013 Okada ............... H01L 29/66462
257/76

* cited by examiner

*Primary Examiner* — Elias M Ullah
(74) *Attorney, Agent, or Firm* — Murphy, Bilak & Homiller, PLLC

(57) ABSTRACT

In one implementation, a vertical field-effect transistor (FET) includes a substrate having a drift region situated over a drain, a body region situated over the drift region and having source diffusions formed therein, a gate trench extending through the body region, and channel regions adjacent the gate trench. The channel regions are spaced apart along the gate trench by respective deep body implants. Each of the deep body implants is situated approximately under at least one of the source diffusions, and has a depth greater than a depth of the gate trench.

20 Claims, 6 Drawing Sheets

VERTICAL FET HAVING REDUCED ON-RESISTANCE

The present application claims the benefit of and priority to a provisional application entitled "Low Voltage MOSFET Design with Three Dimensional Depletion," Ser. No. 62/092,176 filed on Dec. 15, 2014. The disclosure in this provisional application is hereby incorporated fully by reference into the present application.

BACKGROUND

Background Art

Group IV power transistors, such as silicon based trench type field-effect transistors (trench FETs) are used in a variety of applications. For example, silicon based trench metal-oxide-semiconductor FETs (trench MOSFETs) may be used to implement a power converter, such as a synchronous rectifier, or a direct current (DC) to DC power converter.

For many trench FET applications, it is desirable to substantially minimize the on-resistance ($R_{dson}$) of the transistor. In addition, as the electronic devices and systems utilizing power MOSFETs are continually reduced in size, there is a corresponding need to reduce the size of the MOSFETs themselves. However, conventional strategies for reducing trench MOSFET size may undesirably tend to increase the $R_{dson}$ of those devices.

SUMMARY

The present disclosure is directed to a vertical field-effect transistor (FET) having reduced on-resistance, substantially as shown in and/or described in connection with at least one of the figures, and as set forth in the claims.

DETAILED DESCRIPTION

Figure 1:
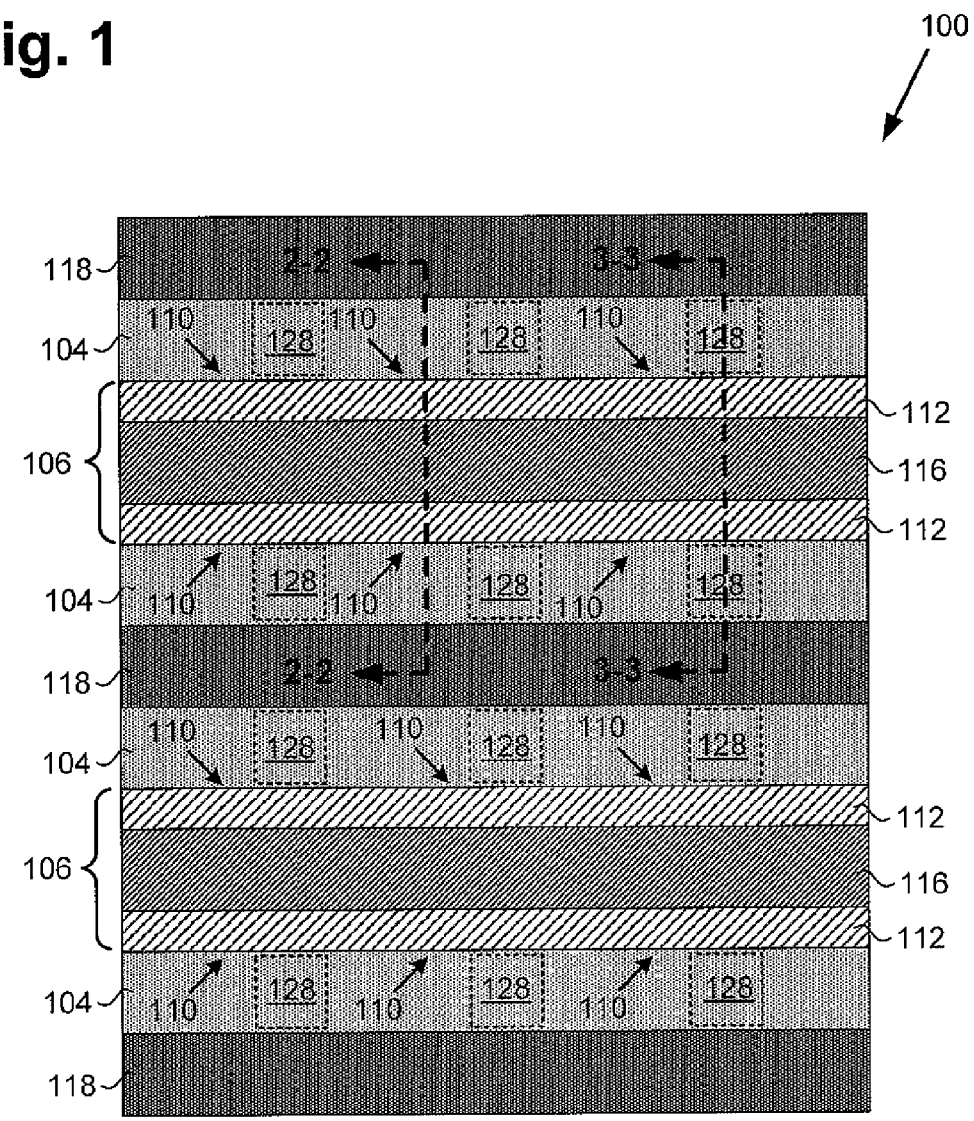
FIG. 1 shows a top view of a vertical field-effect transistor (FET) having reduced on-resistance ($R_{dson}$), according to one exemplary implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, group IV power transistors, such as silicon based trench type field-effect transistors (trench FETs) are used in a variety of applications. For example, silicon based trench metal-oxide-semiconductor FETs (trench MOSFETs) may be used to implement a power converter, such as a synchronous rectifier, or a direct current (DC) to DC power converter. For many trench FET applications, it is desirable to substantially minimize the on-resistance ($R_{dson}$) of the transistor. In addition, as the electronic devices and systems utilizing power MOSFETs are continually reduced in size, there is a corresponding need to reduce the size of the MOSFETs themselves. However, conventional strategies for reducing trench MOSFET size may undesirably tend to increase the $R_{dson}$ of those devices.

The present application discloses a vertical FET having reduced $R_{dson}$. For example, by utilizing multiple deep body implants to interrupt an otherwise substantially continuous channel region adjacent a gate trench, multiple channel regions spaced apart by respective deep body implants are formed. Those channel regions experience enhanced three-dimensional 3-D depletion when the FET is in the off-state. As a result, the drift region conductivity of such a trench FET can be increased without compromising the voltage stand-off capability of the device. Consequently, the principles disclosed in the present application can advantageously provide a trench FET having a reduced $R_{dson}$, reduced dimensions without an increase in $R_{dson}$, or a combination of those desirable features.

It is noted that in the interests of ease and conciseness of description, the present inventive principles are described by reference to specific implementations of silicon based vertical power FETs. However, it is emphasized that such implementations are merely exemplary, and the inventive principles disclosed herein are broadly applicable to other group IV material based, or group III-V semiconductor based, vertical power devices.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power FET may be fabricated using gallium nitride (GaN), in which the group III element or elements include some or a substantial amount of gallium, but may also include other group III elements in addition to gallium.

Referring to FIG. 1, FIG. 1 shows a top view of a vertical FET having reduced $R_{dson}$, according to one exemplary implementation. Vertical FET 100 includes gate trenches 106, highly doped source diffusions 104, and highly doped body body contacts 118. As shown in FIG. 1, gate trenches 106 include gate electrodes 116, and gate dielectric 112 situated between gate electrodes 116 and channel regions 110 adjacent gate trenches 106. Also shown in FIG. 1 are deep body implants 128, depicted in dashed outline to indicate that deep body implants 128 are situated approximately under highly doped source diffusions 104 and are represented in FIG. 1 as though seen through source diffusions 104.

According to the implementation shown in FIG. 1, deep body implants 128 are shown as spatially confined implants situated substantially only under highly doped source diffusions 104. That is to say, according to the present exemplary implementation, deep body implants do not extend under highly doped body contacts 118 or under gate trenches 106. It is noted that, in addition to the features of vertical FET 100 identified above, FIG. 1 also includes perspective lines 2-2 and 3-3 corresponding respectively to the cross-sectional views of vertical FET 100 shown in FIG. 2 and FIG. 3, and described in greater detail below.

Figure 2:
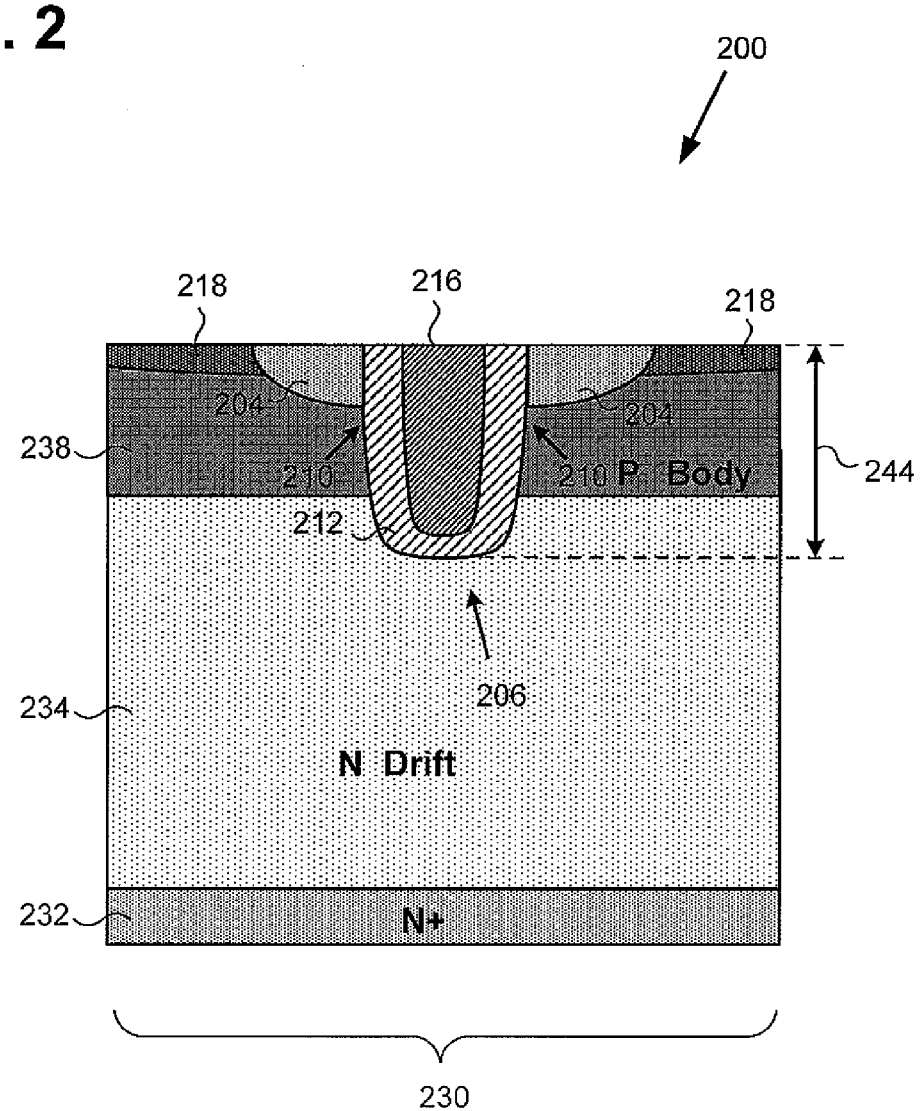
FIG. 2 shows a cross-sectional view of the exemplary vertical FET of FIG. 1 along perspective lines 2-2 in that figure.

Continuing to FIG. 2, FIG. 2 shows a cross-sectional view of exemplary vertical FET 200 along perspective lines 2-2 in FIG. 1. As shown in FIG. 2, vertical FET 200 includes highly doped N type drain 232 at a bottom surface of substrate 230, and N type drift region 234 situated over highly doped N type drain 232. In addition, vertical FET 200 includes P type body region 238 situated over N type drift region 234 and having highly doped N type source diffusions 204 formed therein, as well as gate trench 206 extending through P type body region 238 into N type drift region 234. Also shown in FIG. 2 are gate electrode 216, gate dielectric 212 lining gate trench 206, highly doped P type body contacts 218, channel regions 210 adjacent gate trench 206, and depth 244 of gate trench 206.

Vertical FET 200 corresponds to vertical FET 100, in FIG. 1, and may share any of the characteristics attributed to that corresponding feature in the present application. In other words, highly doped N type source diffusions 204 and highly doped P type body contacts 218 correspond to respective highly doped source diffusions 104 and highly doped body contacts 118, in FIG. 1, and may share any of the characteristics attributed to those corresponding features in the present application. In addition, gate trench 206, gate electrode 216, and gate dielectric 212, in FIG. 2, correspond respectively to gate trenches 106, gate electrodes 116, and gate dielectric 112, in FIG. 1, and may share any of the characteristics attributed to those corresponding features in the present application. Moreover, channel regions 210 adjacent gate trench 206 correspond to channel regions 110 adjacent gate trench 106, in FIG. 1, and may share any of the characteristics attributed to those corresponding features in the present application.

It is noted that channel regions 210 adjacent gate trench 206 are controlled by insulated gate electrode 216. Channel regions 210 provide respective conductive paths through P type body region 238 immediately adjacent gate trench 206. Consequently, when vertical FET 200 is turned on, channel regions 210 are produced as N type conductive paths through P type body region 238 so as to electrically couple N type drain 232 to N type source diffusions 204 via N type drift region 234. Thus, according to the implementation shown in FIG. 2, channel regions 210 are configured to provide N type conductive channels.

It is further noted that although the implementation shown in FIG. 2 depicts vertical FET 200 as an n-channel device having N type drain 232, N type drift region 234, P type body region 238, and N type source diffusions 204, that representation is merely exemplary. In other implementations, the described polarities can be reversed such that vertical FET 200 may be a p-channel device having a P type drain, a P type drift region, an N type body region, and P type source diffusions.

Substrate 230 may be a silicon (Si) substrate or a silicon carbide (SiC) substrate, for example. In some implementations, substrate 230 may include N type drift region 234 and P type body region 238 formed as epitaxial regions in an epitaxial silicon layer of substrate 230. Formation of such an epitaxial silicon layer may be performed by any suitable method, as known in the art, such as chemical vapor deposition (CVD) or molecular beam epitaxy (MBE), for example. More generally, however, N type drift region 234 and P type body region 238 may be formed in any suitable elemental or compound semiconductor layer included in substrate 230.

Thus, in other implementations, N type drift region 234 and P type body region 238 need not be formed through epitaxial growth, and/or need not be formed of silicon. For example, in one alternative implementation, N type drift region 234 and P type body region 238 can be formed in a float zone silicon layer of substrate 230. In other implementations, N type drift region 234 and P type body region 238 can be formed in either a strained or unstained germanium layer formed as part of substrate 230.

P type body region 238 and highly doped P type body contacts 218 may be formed by implantation and thermal diffusion. For example, boron (B) dopants may be implanted into substrate 230 and diffused to form P type body region 238 and highly doped P type body contacts 218. Highly doped N type source diffusions 204 may be analogously formed by implantation and thermal diffusion of a suitable N type dopant in substrate 230. Such a suitable N type dopant may include arsenic (As) or phosphorous (P), for example.

Gate electrode 216 may be formed using any electrically conductive material typically utilized in the art. For example, gate electrode 216 may be formed of doped polysilicon or metal. Gate dielectric 212 may be formed using any material and any technique typically employed in the art. For example, gate dielectric 212 may be formed of silicon dioxide ($SiO_2$), and may be deposited or thermally grown to produce gate dielectric 212.

Figure 3:
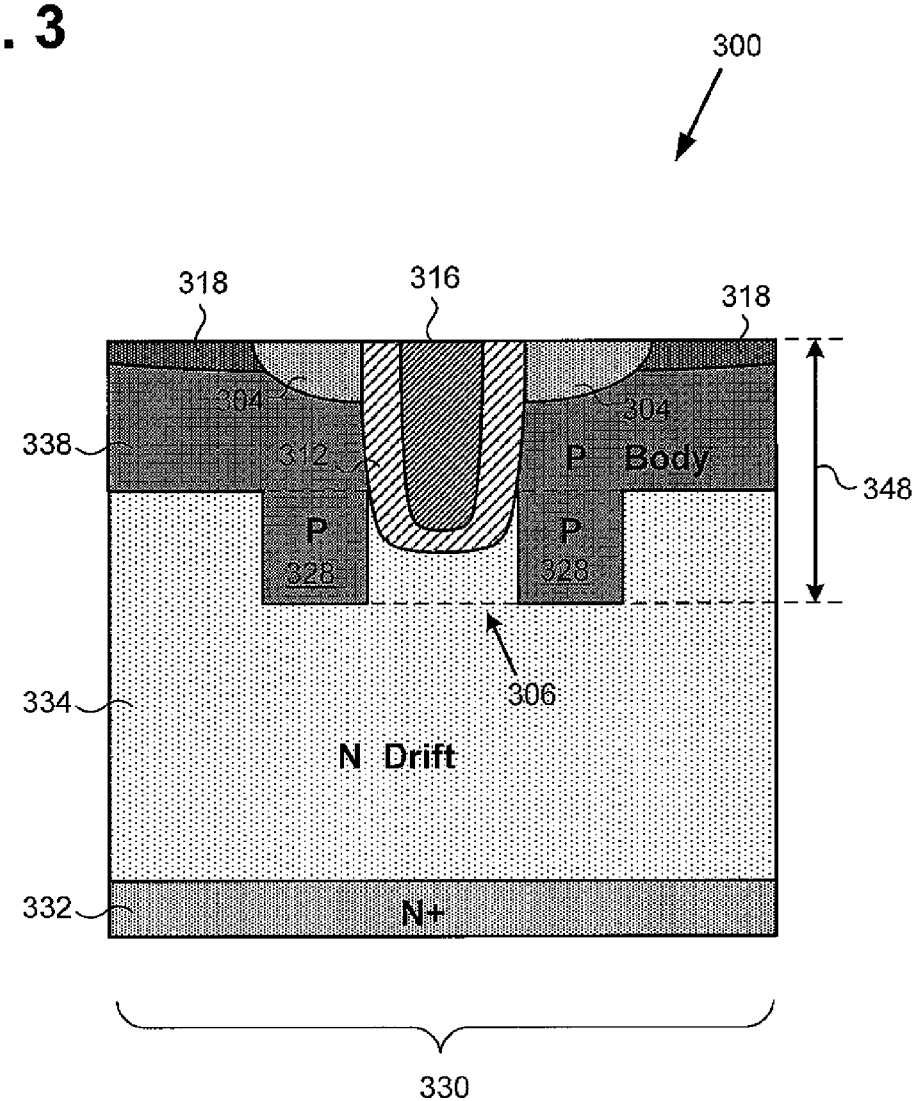
FIG. 3 shows a cross-sectional view of the exemplary vertical FET of FIG. 1 along perspective lines 3-3 in that figure.

Moving to FIG. 3, FIG. 3 shows a cross-sectional view of exemplary vertical FET 300 along perspective lines 3-3 in FIG. 1. As shown in FIG. 3, vertical FET 300 includes highly doped N type drain 332 at a bottom surface of substrate 330, and N type drift region 334 situated over highly doped N type drain 332. In addition, vertical FET 300 includes P type body region 338 situated over N type drift region 334 and having highly doped N type source diffusions 304 formed therein, as well as gate trench 306 extending through P type body region 338. Also shown in FIG. 3 are gate electrode 316, gate dielectric 312 lining gate trench 306, highly doped P type body contacts 318, and P type deep body implants 328 formed in N type drift region 334 to a depth 348.

Vertical FET 300 corresponds to vertical FET 100/200, in FIG. 1/2, and may share any of the characteristics attributed to that corresponding feature in the present application. In other words, substrate 330, N type drain 332, N type drift region 334, and P type body region 338 correspond respectively to substrate 230, N type drain 232, N type drift region 234, and P type body region 238, in FIG. 2, and may share any of the characteristics attributed to those corresponding features in the present application. In addition, highly doped N type source diffusions 304 and highly doped P type body contacts 318 correspond to respective highly doped source diffusions 104/204 and highly doped body contacts 118/218 in FIG. 1/2, and may share any of the characteristics attributed to those corresponding features in the present application.

Gate trench 306 including gate electrode 316 and gate dielectric 312, in FIG. 3, corresponds to gate trenches 106/206 including respective gate electrodes 116/216 and gate dielectric 112/212, in FIG. 1/2, and may share any of the characteristics attributed to those corresponding features in the present application. That is to say, like gate trench 206, in FIG. 2, gate trench 306 has depth 244. Moreover, P type deep body implants 328 correspond to deep body implants 128, in FIG. 1, and may share any of the characteristics attributed to those corresponding features in the present application.

According to the implementation shown in FIG. 3, P type deep body implants 328 are situated approximately under N type source diffusions 304. In other words, in the present exemplary implementation, P type deep body implants 328 do not extend under gate trench 306 and do not extend under highly doped P type body contacts 318. However, in other implementations, P type deep body implants 328 may extend under gate trench 306 and/or highly doped P type body contacts 318, in addition to N type source diffusions 304. It is noted that although deep body implants 328 are P type when formed in n-channel vertical FET 300, in implementations in which vertical FET 300 is a p-channel device having a P type drift region, deep body implants 328 are N type.

P type deep body implants 328 have the same conductivity type as P type body region 338, but extend to depth 348 that is greater than depth 244 of gate trench 306. In addition, the doping concentration of P type deep body implants 328 may be substantially equal to the doping concentration of P type body region 338. As a result, and as shown in FIG. 3, the presence of P type deep body implants 328 under highly doped N type source diffusions 304 effectively extends the depth of P type body region 338 to depth 348 under N type source diffusions 304. Consequently, channel regions corresponding to channel regions 110/210 in FIGS. 1/2 are absent from the cross-sectional portion of vertical FET 300 shown in FIG. 3. Moreover, and as further seen by reference to FIG. 1, channel regions 110/210 are spaced apart along gate trench 106/206/306 by respective P type deep body implants 128/328.

In addition to spacing channel regions 110/210 apart along gate trench 106/206/306, the presence of P type deep body implants 328 results in 3-D depletion of N type drift region 234/334. That is to say, in addition to the vertical depletion of N type drift region 234/334 present in conventional trench FET structures, P type deep body implants 328 provide additional lateral depletion of N type drift region 234/334. As a result, the conductivity of N type drift region 234/334 may be increased relative to conventional vertical FET structures, thereby reducing $R_{dson}$, without compromising the voltage standoff capability of vertical FET 300. Alternatively, or in addition, vertical FET 300 may be implemented as a smaller device than is possible using conventional designs, without increasing the $R_{dson}$ of vertical FET 300.

Figure 4:
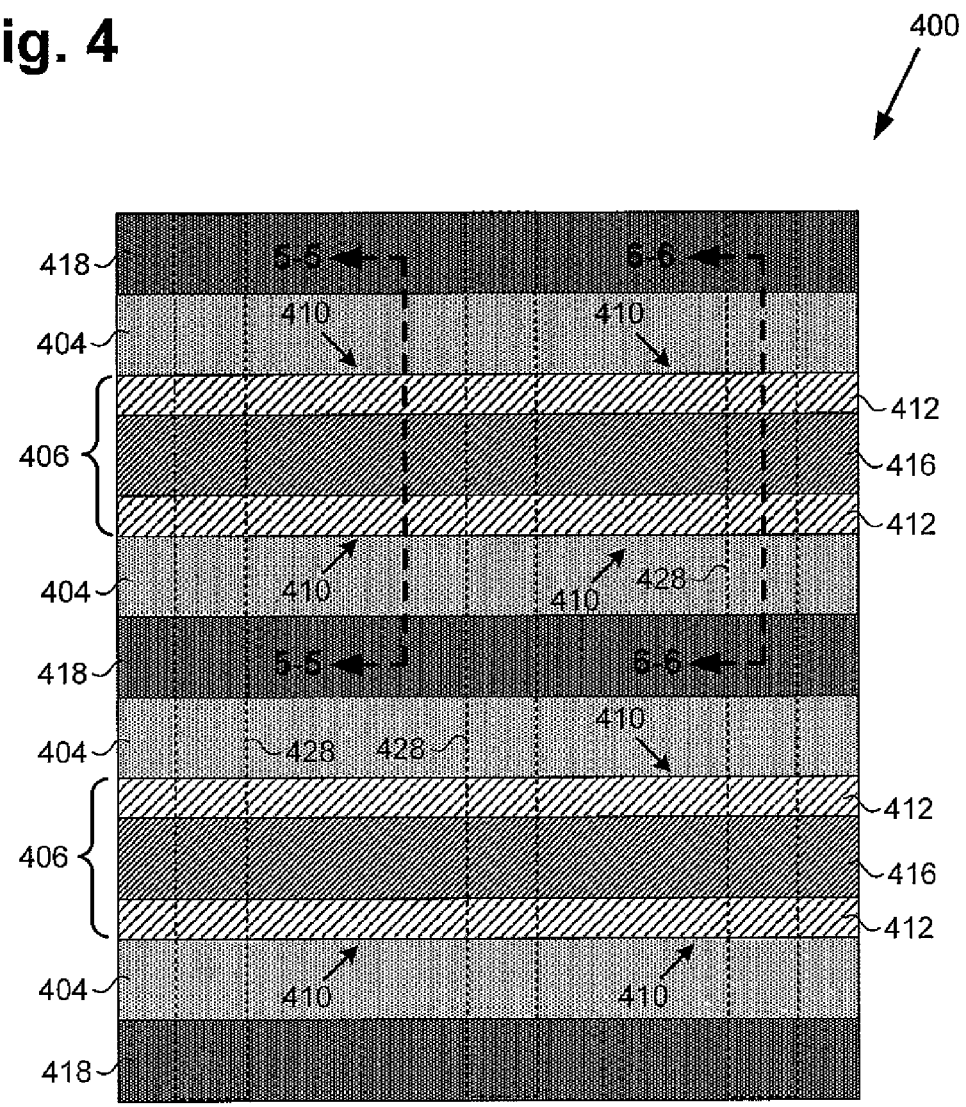
FIG. 4 shows a top view of a vertical FET having reduced $R_{dson}$, according to another exemplary implementation.

Referring now to FIG. 4, FIG. 4 shows a top view of a vertical FET having reduced $R_{dson}$, according to another exemplary implementation. Vertical FET 400 includes gate trenches 406, highly doped source diffusions 404, and highly doped body body contacts 418. As shown in FIG. 1, gate trenches 406 include gate electrodes 416, and gate dielectric 412 situated between gate electrodes 416 and channel regions 410 adjacent gate trenches 406.

Also shown in FIG. 4 are deep body implants 428, depicted in dashed outline to indicate that deep body implants 428 extend under highly doped body contacts 418, highly doped source diffusions 404, and gate trenches 406, and are represented in FIG. 4 as though seen through those overlying features. Thus, according to the exemplary implementation shown in FIG. 4, deep body implants 428 may take the form of substantially continuous deeply implanted stripes situated below and extending under each of highly doped body contacts 418, highly doped source diffusions 404, and gate trenches 406. It is noted that, in addition to the features of vertical FET 400 identified above, FIG. 4 also includes perspective lines 5-5 and 6-6 corresponding respectively to the cross-sectional views of vertical FET 400 shown in FIG. 5 and FIG. 6, and described in greater detail below.

Figure 5:
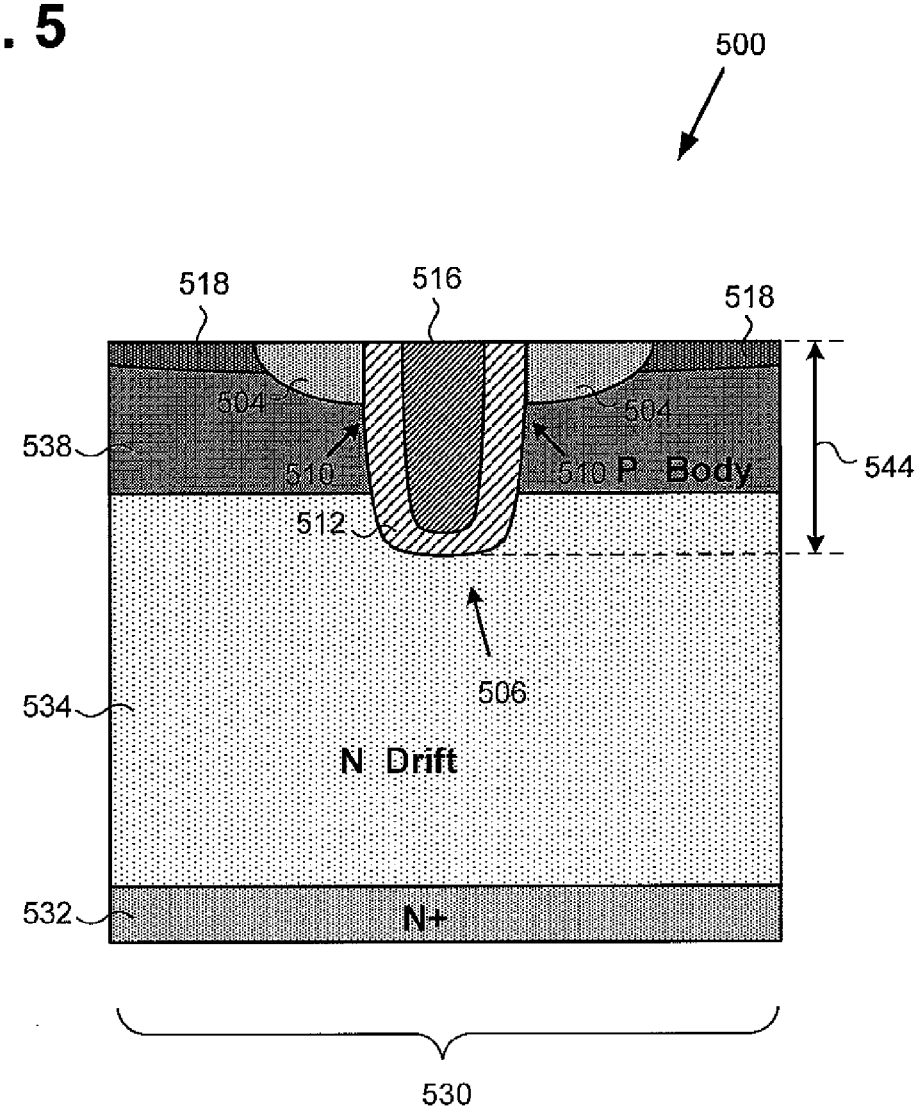
FIG. 5 shows a cross-sectional view of the exemplary vertical FET of FIG. 4 along perspective lines 5-5 in that figure.

Continuing to FIG. 5, FIG. 5 shows a cross-sectional view of exemplary vertical FET 500 along perspective lines 5-5 in FIG. 4. As shown in FIG. 5, vertical FET 500 includes highly doped N type drain 532 at a bottom surface of substrate 530, and N type drift region 534 situated over highly doped N type drain 532. In addition, vertical FET 500 includes P type body region 538 situated over N type drift region 534 and having highly doped N type source diffusions 504 formed therein, as well as gate trench 506 extending through P type body region 538 into N type drift region 534. Also shown in FIG. 5 are gate electrode 516, gate dielectric 512 lining gate trench 506, highly doped P type body contacts 518, channel regions 510 adjacent gate trench 506, and depth 544 of gate trench 506.

Vertical FET 500 corresponds to vertical FET 400, in FIG. 4, and may share any of the characteristics attributed to that corresponding feature in the present application. In addition, highly doped N type source diffusions 504 and highly doped P type body contacts 518 correspond in general to respective highly doped source diffusions 104/204/304/404 and highly doped body contacts 118/218/318/418, in FIG. 1/2/3/4, and may share any of the characteristics attributed to those corresponding features in the present application. Furthermore, gate trench 506, gate electrode 516, and gate dielectric 512, in FIG. 5, correspond in general to gate trench(es) 106/206/306/40, gate electrode(s) 116/216/316/416, and gate dielectric 112/212/312/412, in FIG. 1/2/3/4, and may share any of the characteristics attributed to those corresponding features in the present application.

Channel regions 510 adjacent gate trench 506 correspond to channel regions 110/210/410 adjacent gate trench(es) 106/206/406, in FIG. 1/2/4, and may share any of the characteristics attributed to those corresponding features in the present application. Moreover, substrate 530, highly doped drain 532, N type drift region 534, P type body region 538, and depth 544 of gate trench 506 correspond in general to respective substrate 230, highly doped drain 232, N type drift region 234, P type body region 238, and depth 244 of gate trench 206, in FIG. 2, and may share any of the characteristics attributed to those corresponding features in the present application.

It is noted that channel regions 510 adjacent gate trench 506 are controlled by insulated gate electrode 516. Channel regions 510 provide respective conductive paths through P type body region 538 immediately adjacent gate trench 506. Consequently, when vertical FET 500 is turned on, channel regions 510 are produced as N type conductive paths through P type body region 538 so as to electrically couple N type drain 532 to N type source diffusions 504 via N type drift region 534. Thus, according to the implementation shown in FIG. 5, channel regions 510 are configured to provide N type conductive channels.

It is further noted that although the implementation shown in FIG. 5 depicts vertical FET 500 as an n-channel device having N type drain 532, N type drift region 534, P type body region 538, and N type source diffusions 504, that representation is merely exemplary. In other implementations, the described polarities can be reversed such that vertical FET 500 may be a p-channel device having a P type drain, a P type drift region, an N type body region, and P type source diffusions.

Figure 6:
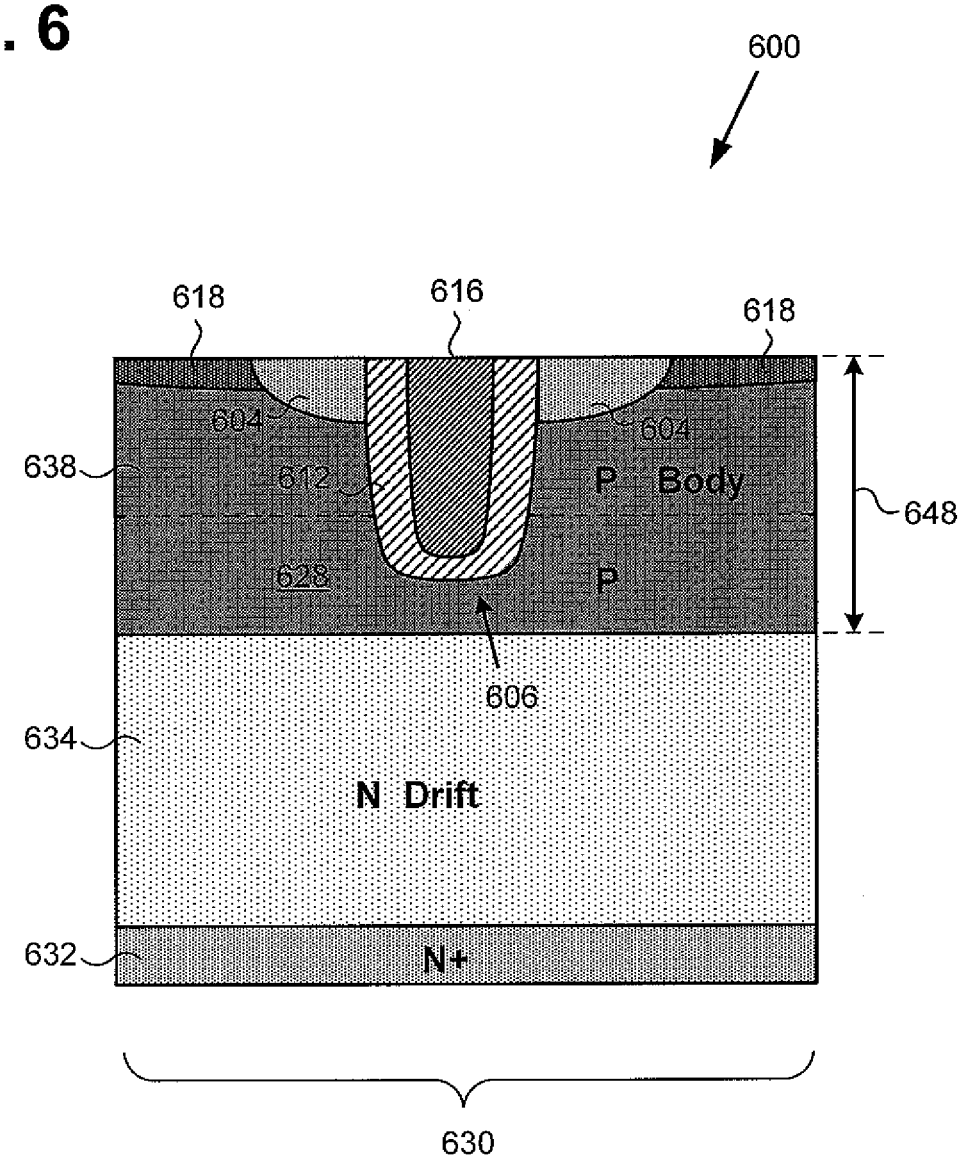
FIG. 6 shows a cross-sectional view of the exemplary vertical FET of FIG. 4 along perspective lines 6-6 in that figure.

Moving to FIG. 6, FIG. 6 shows a cross-sectional view of exemplary vertical FET 600 along perspective lines 6-6 in FIG. 4. As shown in FIG. 6, vertical FET 600 includes highly doped N type drain 632 at a bottom surface of substrate 630, and N type drift region 634 situated over highly doped N type drain 632. In addition, vertical FET 600 includes P type body region 638 situated over N type drift region 634 and having highly doped N type source diffusions 604 formed therein, as well as gate trench 606 extending through P type body region 638. Also shown in FIG. 6 are gate electrode 616, gate dielectric 612 lining gate trench 606, highly doped P type body contacts 618, and P type deep body implant 628 formed in N type drift region 634 to a depth 648.

Vertical FET 600 corresponds to vertical FET 400/500, in FIG. 4/5, and may share any of the characteristics attributed to that corresponding feature in the present application. In other words, substrate 630, N type drain 632, N type drift region 634, and P type body region 638 correspond respectively to substrate 530, N type drain 532, N type drift region 534, and P type body region 538, hi FIG. 5, and may share any of the characteristics attributed to those corresponding features in the present application. In addition, highly doped N type source diffusions 604 and highly doped P type body contacts 618 correspond to respective highly doped source diffusions 404/504 and highly doped body contacts 418/518 in FIG. 415, and may share any of the characteristics attributed to those corresponding features in the present application.

Gate trench 606 including gate electrode 616 and gate dielectric 612, in FIG. 6, corresponds to gate trench(es) 406/506 including respective gate electrodes 416/516 and gate dielectric 412/512, in FIG. 4/5, and may share any of the characteristics attributed to those corresponding features in the present application. That is to say, like gate trench 506, in FIG. 5, gate trench 606 has depth 544. Moreover, P type deep body implant 628 corresponds to deep body implants 428, in FIG. 4, and may share any of the characteristics attributed to those corresponding features in the present application.

According to the implementation shown in FIG. 6, P type deep body implant 628 is situated below and extends under highly doped P type body contacts 618, N type source diffusions 604, and gate trench 606. It is noted that although deep body implant 628 is P type when formed in n-channel vertical FET 600, in implementations in which vertical FET 600 is a p-channel device having a P type drift region, deep body implant 628 is N type.

P type deep body implant 628 has the same conductivity type as P type body region 638, but extends to depth 648 that is greater than depth 544 of gate trench 606. In addition, the doping concentration of P type deep body implant 628 may be substantially equal to the doping concentration of P type body region 638. As a result, and as shown in FIG. 6, the presence of P type deep body implant 628 under highly doped N type source diffusions 604 effectively extends the depth of P type body region 638 to depth 648. Consequently, channel regions corresponding to channel regions 410/510 in FIGS. 4/5 are absent from the cross-sectional portion of vertical FET 600 shown in FIG. 6. Moreover, and as further seen by reference to FIG. 4, channel regions 410/510 are spaced apart along gate trench 406/506/606 by respective P type deep body implant(s) 428/628.

In addition to spacing channel regions 410/510 apart along gate trench 406/506/606, the presence of deep body implant(s) 428/628 results in 3-D depletion of N type drift region 534. That is to say, in addition to the vertical depletion of N type drift region 534 present in conventional vertical FET structures, deep body implant(s) 428/628 provide(s) additional lateral depletion of N type drift region 534 between successive deep body implants 428/628, as shown by FIG. 4. As a result, the conductivity of N type drift region 534 may be increased relative to conventional vertical FET structures, thereby reducing $R_{dson}$, without compromising the voltage standoff capability of vertical FET 600. Alternatively, or in addition, vertical FET 600 may be implemented as a smaller device than is possible using conventional designs, without increasing the $R_{dson}$ of vertical FET 600.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A vertical field-effect transistor (FET) comprising:
   a substrate having a drift region of a first conductivity type situated over a drain of the first conductivity type, a body region of a second conductivity type opposite the first conductivity type situated over said drift region and having source diffusions of the first conductivity type formed therein, a gate trench extending through said body region and into said drift region, and channel regions adjacent said gate trench;
   said channel regions being spaced apart along id gate trench by respective spatially confined deep body implants of the second conductivity type;
   each of said spatially confined deep body implants being situated below said body region approximately under at least one of said source diffusions and extending deeper into said drift region than said gate trench;
   each of said spatially confined deep body implants providing both lateral and vertical depletion of said drift region.

2. The vertical FET of claim 1, wherein said spatially confined deep body implants do not extend under said gate trench.

3. The vertical FET of claim 1, wherein each of said spatially confined deep body implants extends under said gate trench and said at least one of said source diffusions.

4. The vertical FET of claim 1, further comprising highly doped body contacts situated adjacent said source diffusions, wherein said spatially confined deep body implants do not extend under said highly doped body contacts.

5. The vertical FET of claim 1, further comprising highly doped body contacts situated adjacent said source diffusions, wherein each of said spatially confined deep body implants extends under at least one of said highly doped body contacts and said at least one of said source diffusions.

6. The vertical FET of claim 1, further comprising highly doped body contacts situated adjacent said source diffusions, wherein said spatially confined deep body implants extend under said highly doped body contacts, said source diffusions, and said gate trench.

7. The vertical FET of claim 1, wherein said vertical FET is an n-channel device and wherein said spatially confined deep body implants are P type.

8. The vertical FET of claim 1, wherein said vertical FET is a p-channel device and wherein said spatially confined deep body implants are N type.

9. The vertical FET of claim 1, wherein a doping concentration of said spatially confined deep body implants is substantially equal to a doping concentration of said body region.

10. The vertical FET of claim 1, wherein said vertical FET is a group IV semiconductor based FET.

11. The vertical FET of claim 1, wherein said vertical FET is a silicon FET.

12. An n-channel vertical field-effect transistor (FET) comprising:
- a substrate having an epitaxial N type drift region situated over an N type drain, an epitaxial P type body region situated over said epitaxial N type drift region and having N type source diffusions formed therein, a gate trench extending through said epitaxial P type body region and into said N type drift region, and channel regions adjacent said gate trench;
- said channel regions being spaced apart along said gate trench by respective spatially confined P type deep body implants which extend from a bottom of said P type body region into said epitaxial drift region;
- each of said spatially confined P type deep body implants being situated approximately under at least one of said N type source diffusions and having a depth greater than a depth of said gate trench;
- each of said spatially confined P type deep body implants providing both lateral and vertical depletion of said N type drift region.

13. The n-channel vertical FET of claim 12, wherein said spatially confined P type deep body implants do not extend under said gate trench.

14. The n-channel vertical FET of claim 12, wherein each of said spatially confined P type deep body implants extends under said gate trench and said at least one of said N type source diffusions.

15. The n-channel vertical FET of claim 12, further comprising highly doped body contacts situated adjacent said N type source diffusions, wherein said spatially confined P type deep body implants do not extend under said highly doped body contacts.

16. The n-channel vertical FET of claim 12, further comprising highly doped body contacts situated adjacent said N type source diffusions, wherein each of said spatially confined P type deep body implants extends under at least one of said highly doped body contacts and said at least one of said N type source diffusions.

17. The n-channel vertical FET of claim 12, further comprising highly doped body contacts situated adjacent said N type source diffusions, wherein said spatially confined P type deep body implants extend under said highly doped body contacts, said N type source diffusions, and said gate trench.

18. The n-channel vertical FET of claim 12, wherein a doping concentration of said spatially confined P type deep body implants is substantially equal to a doping concentration of said epitaxial type body region.

19. The n-channel vertical FET of claim 12, wherein said n-channel vertical FET is a group IV semiconductor based FET.

20. The n-channel vertical FET of claim 12, wherein said n-channel vertical FET is a silicon FET.

* * * * *

UNITED STATES PATENT AND TRADEMARK OFFICE
CERTIFICATE OF CORRECTION

PATENT NO. : 9,590,096 B2
APPLICATION NO. : 14/942911
DATED : March 7, 2017
INVENTOR(S) : H. Naik et al.

Page 1 of 1

It is certified that error appears in the above-identified patent and that said Letters Patent is hereby corrected as shown below:

In the Claims

Claim 18 (Column 10, Line 28), after "epitaxial" please insert --P type--.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*